United States Patent [19]

Corboy, Jr. et al.

[11] Patent Number: 4,578,142
[45] Date of Patent: Mar. 25, 1986

[54] METHOD FOR GROWING MONOCRYSTALLINE SILICON THROUGH MASK LAYER

[75] Inventors: John F. Corboy, Jr., Ringoes; Lubomir L. Jastrzebski, Plainsboro; Scott C. Blackstone, Hopewell; Robert H. Pagliaro, Jr., Trenton, all of N.J.

[73] Assignee: RCA Corporation, Princeton, N.J.

[21] Appl. No.: 608,544

[22] Filed: May 10, 1984

[51] Int. Cl.⁴ ............................................. C30B 25/04
[52] U.S. Cl. ......................... 156/612; 156/DIG. 111; 156/644; 148/DIG. 26
[58] Field of Search ............... 156/610, 612, 613, 644, 156/646, 649, 657, 662, DIG. 111; 148/175, 187, DIG. 50, 51, DIG. 26; 29/578; 357/20, 50

[56] References Cited

U.S. PATENT DOCUMENTS

| 3,239,372 | 3/1966 | Sirtl | 117/201 |
|---|---|---|---|
| 3,425,879 | 2/1969 | Shaw et al. | 156/612 |
| 3,746,908 | 7/1973 | Engeler | 315/10 |
| 3,945,864 | 3/1976 | Goldsmith | 148/175 |
| 3,985,590 | 10/1976 | Mason | 156/612 |
| 4,412,868 | 11/1983 | Brown et al. | 148/1.5 |

FOREIGN PATENT DOCUMENTS 963799 7/1964 United Kingdom .
1358438 7/1974 United Kingdom .

OTHER PUBLICATIONS

International Publication Number WO81/02948 MIT 10/81.
"A Technique for Producing Epitaxial Films on Reuseable Substrates, R. W. McClelland et al., Appl. Phys. Lett. 37(6), Sep. 15, 1980.
J. Electrochem. Soc., Apr. 1967, vol. 114, No. 4, pp. 381-388, The Growth and Etching of Si Through Windows in SiO₂, by W. G. Oldham and R. Holmstrom.
Semiconductor Silicon, Electrochem. Soc., May 1969, pp. 169-188, Selective Epitaxy of Silicon Under Quasi-Equilibrium Conditions, by Erhard Sirtl and Hartmut Seiter.
Advances in Dichlorosilane Epitaxial Technology, D. J. DeLong, Solid State Technology, Oct. 1972, pp. 29-34, 41.
The Status of Silicon Epitaxy, W. R. Runyan, Semiconductor Silicon, R. R. Haberrecht & E. L. Klein, Eds., New York: Electrochemical Society, May 1969, pp. 169-188.
Selective Epitaxial Deposition of Silicon, B. D. Joyce et al., Nature, vol. 195, pp. 485, 6, Aug. 4, 1962.
The "Epicon" Array: A New Semiconductor Array-Type Camera Tube Structure, W. E. Engeler et al., Applied Physics Letters, vol. 16, No. 5, Mar. 1, 1970, pp. 202-205.
The Epicon Camera Tube: An Epitaxial Diode Array Vidicon, S. M. Blumenfeld et al., IEEE Trans., vol. ED18, No. 11, Nov. 1971, pp. 1036-1042.

Primary Examiner—Hiram H. Bernstein
Attorney, Agent, or Firm—Birgit E. Morris; Donald S. Cohen; Kenneth R. Glick

[57] ABSTRACT

A monocrystalline silicon layer is formed on a mask layer on a semiconductor substrate. An apertured mask layer is disposed on the substrate, and an epitaxial layer is then grown by a two-step deposition/etching cycle. By repeating the deposition/etching cycle a predetermined number of times, monocrystalline silicon will be grown from the substrate surface, through the mask aperture, and over the mask layer.

16 Claims, 7 Drawing Figures

METHOD FOR GROWING MONOCRYSTALLINE SILICON THROUGH MASK LAYER

This is a continuation of application Ser. No. 338,958, filed Jan. 12, 1982 now abandoned.

BACKGROUND OF THE INVENTION

The present invention relates to a method for epitaxially forming a layer of monocrystalline silicon. More particularly, it relates to a process for fabricating monocrystalline silicon on an apertured mask layer which is disposed on a monocrystalline substrate.

In the field of semiconductor device processing epitaxially deposited silicon is commonly used in a variety of applications. Basically, this deposition involves the precipitation of silicon from a source gas onto a crystal lattice, such that the deposited silicon forms a structure which continues the crystal lattice Conventionally used silicon-source gases include silane ($SiH_4$), silicon tetrachloride ($SiCl_4$), trichlorosilane ($SiHCl_3$), and dichlorosilane ($SiH_2Cl_2$), and the details of typical processing are described in ADVANCES IN DICHLOROSILANE EPITAXIAL TECHNOLOGY, D. J. DeLong, Solid State Technology, Oct. 1972, pp. 29-34, 41, and in U.S. Pat. No. 3,945,864, METHOD OF GROWING THICK EPITAXIAL LAYERS OF SILICON, N. Goldsmith et al, issued Mar. 23, 1976. The quality and rate of silicon deposition is a strong function of such parameters as deposition temperature and specific gas composition, as elaborated upon in U.S. Pat. No. 3,239,372, METHOD OF PRODUCING SINGLE CRYSTALLINE SILICON, E Sirtl, issued Mar. 8, 1966, as well as in the previously cited references.

Epitaxial films of silicon have been selectively grown within the apertures of a silicon dioxide ($SiO_2$) mask on the surface of a single-crystalline silicon substrate. An example of such a process is described in SELECTIVE EPITAXIAL DEPOSITION OF SILICON, B. D. Joyce et al, Nature, Vol. 195, pp. 485, 6, Aug. 4, 1962. Selective epitaxial deposition has also been used to form a grid of monocrystalline silicon islands wherein the grid is specified by a particular center-to-center spacing of an array of apertures in a silicon dioxide layer, and wherein each silicon island overgrows the silicon dioxide surrounding each aperture a specific distance. An example of such an overgrown structure and its manufacturing method is described in THE "EPICON" ARRAY: A NEW SEMICONDUCTOR ARRAY-TYPE CAMERA TUBE STRUCTURE, W. E. Engeler et al, Applied Physics Letters, Vol. 16, No. 5, Mar. 1, 1970; THE EPICON CAMERA TUBE: AN EPITAXIAL DIODE ARRAY VIDICON, S. M. Blumenfeld et al, IEEE Trans., Vol. ED18, No. 11, Nov. 1971; and in U.S. Pat. No. 3,746,908, SOLID STATE LIGHT SENSITIVE STORAGE ARRAY, W. E. Engeler, issued July 17, 1973.

As suggested by the cited references, the process of epitaxially depositing monocrystalline silicon is well established in the semiconductor industry. For example, the effect of reaction temperature, deposition gas composition, and gas flow rate on both the quality and deposition rate is well characterized. It is well-known that while monocrystalline silicon will nucleate on a monocrystalline substrate, a monocrystalline layer will not be nucleated on a polycrystalline or amorphous surface. Typically, when a non-single-crystalline surface, such as the surface of a silicon dioxide layer, is subjected to an epitaxial deposition environment, a non-single-crystalline silicon film will be deposited.

Heretofore, the formation of monocrystalline silicon on silicon dioxide was achieved by creating a grid of monocrystalline silicon islands as disclosed by Engeler and Blumenfeld. This process relies on the migration of silicon atoms across the oxide surface between the silicon islands so as to add to the growth of the islands. If at a particular temperature the migration distance of this precipitating silicon is less than half the distance between silicon islands, nucleation of non-single-crystalline silicon will occur on the oxide between the monocrystalline silicon islands. In an effort to avoid the formation of a non-single-crystalline silicon layer, and provide a deposition process which is not constrained by the geometry of the epitaxial nucleation site or sites or the growth time, the present invention was discovered.

SUMMARY OF THE INVENTION

A mask layer is provided on a semiconductor substrate, wherein the mask layer includes at least one aperture which exposes a monocrystalline portion of the substrate. Silicon is then epitaxially deposited from a gas mixture which comprises a silicon-source gas, and a carrier gas. The substrate is next exposed to a gas mixture comprising an etching gas and a carrier gas such that a portion of the previously deposited silicon is etched. This deposition and etching cycle is then repeated an appropriate number of times so as to achieve a monocrystalline silicon layer of predetermined size on the mask layer.

DETAILED DESCRIPTION

Figure 1:
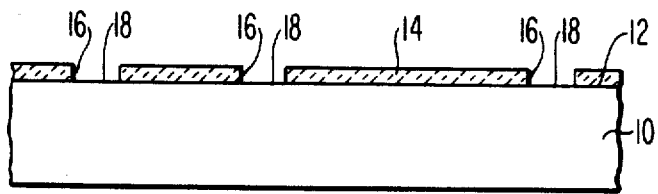
FIGS. 1, 2A and 2B illustrate the process sequence of the present invention.

As illustrated in FIG. 1, a substrate 10 having a substantially planar surface 12 is initially provided. In the preferred embodiment the substrate material is monocrystalline silicon, and the surface 12 represents a major crystallographic surface. However, the substrate material is not so limited, as will subsequently be discussed. An apertured mask 14, which in the preferred embodiment comprises a silicon dioxide ($SiO_2$) layer of approximately 0.1 to 1.0 microns in thickness, is disposed on the substrate surface 12. Silicon dioxide is selected as a mask material because it is amorphous and it can physically withstand subsequent epitaxial deposition processing. Additionally, an $SiO_2$ mask 14 can be readily formed and apertures can be readily generated therein by conventional photolithographic processing. However, it should be recognized that the present invention is not limited to the use of $SiO_2$, nor is it limited to a mask of a particular thickness. The important physical characteristics of the mask 14 are that it be non-single-crystalline and that it be capable of withstanding the temperatures encountered during subsequent processing. Other suitable mask materials include, for example, silicon nitride and aluminum oxide.

In FIG. 1, the mask 14 includes a plurality of apertures 16. The size, spacing, and configuration of these apertures 16 can vary. Furthermore, although the embodiment illustrated in FIG. 1 shows a plurality of apertures 16, the present invention requires only that a single aperture 16 be present. This multi-apertured embodiment is shown only by way of example. The illustrated apertures 16 might comprise, for example, a plurality of squares, circles or stripes.

The portion of the substrate surface 12 exposed by each aperture 16 will hereinafter be referred to as a nucleation site 18. The nucleation sites 18 in FIG. 1 can be located anywhere along the surface 12. The only restriction is that each nucleation site 18 be monocrystalline in structure. This can be achieved, for example, by providing either a substrate 10 of bulk monocrystalline material; a monocrystalline layer across the surface 12 of an otherwise non-single-crystalline substrate 10; or a polycrystalline surface 12 wherein the grain size is such that each aperture 16 can be defined within the boundaries of a grain.

Figure 2A:
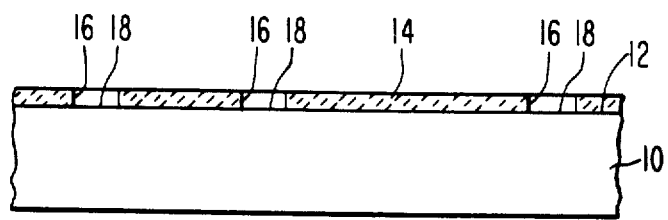
Figure 2B:
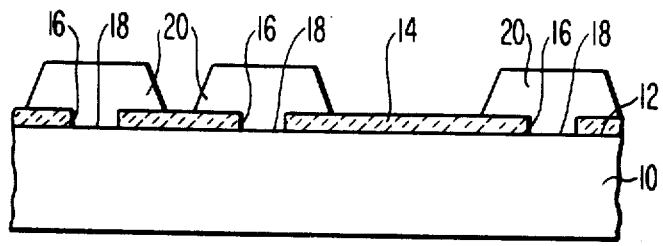

The masked structure of FIG. 1 is then subjected to a two stage, silicon deposition/etching cyle. In the first stage, hereinafter the deposition stage, silicon is deposited from a gas mixture which includes a silicon-source gas and a carrier gas. Additionally, a silicon-etching gas can be included during the deposition stage. In the second stage, hereinafter the etching stage, a portion of the silicon deposited during the first stage is etched in a gas mixture of a silicon-etching gas and a carrier gas. This deposition/etching cycle is then repeated, if desired, any number of times, until a monocrystalline silicon layer of predetermined size is formed on the mask layer 14. At each nucleation site 18, crystalline growth will proceed substantially vertically (perpendicular to the surface 12) through the thickness of the mask 14, so as to yield the structure of FIG. 2A, and then will additionally proceed laterally, across the surface of the mask 14. Repetition of the cycle will eventually yield a monocrystalline silicon island 20 at each nucleation site 18, as illustrated in FIG. 2B.

The deposition/etching cycle can be performed within a conventional reactor, at atmospheric or reduced pressure, and a variety of silicon-source gases, silicon-etching gases, and carrier gases can be used. Using dichlorosilane as the silicon-source gas, HCl as the etching gas (in both stages), and hydrogen as the carrier gas, exemplary deposition/etching parameters are summarized in the table below.

| | FLOW RATE (liters/min) | | | |
|---|---|---|---|---|
| | $H_2$ | HCl | $SiH_2Cl_2$ | TIME (min) |
| DEPOSITION STAGE | 24 | 0.15 | 0.20 | 2 |
| ETCHING STAGE | 24 | 0.30 | — | 1 |
| FLOW VELOCITY: | 24 cm/sec | | | |
| REACTOR TEMPERATURE: | 1100° C. (pyrometer reading) | | | |
| PRESSURE: | 1 atm | | | |

These parameters were observed to produce a vertical growth rate of approximately 1.0 microns/min and a horizontal-to-vertical growth rate ratio of 1.5.

The vertical growth rate, horizontal-to-vertical growth rate ratio, and the determination of whether to use a silicon-etching gas during the deposition stage vary as a function of silicon-source gas and flow rate, silicon-etching gas and flow rate, deposition stage time, etching stage time, flow velocity, reactor temperature, and deposition pressure. For example, using $SiH_2Cl_2$ as the silicon-source gas, the vertical growth rate can be varied between approximately 0.4 and 2.0 microns/min by varying the $SiH_2Cl_2$ flow rate between approximately 0.10 and 1.0 liters/min and appropriately adjusting the silicon-etching gas flow rate during the deposition stage.

The horizontal-to-vertical growth rate ratio generally increases at lower reactor temperatures. For example, using the parameters indicated in the table, the horizontal-to-vertical growth rate ratio was observed to vary between approximately 1.0 and 2.2 as the reactor temperature was varied from 1200° C. to 1050° C.

The extent to which reactor temperature influences growth rate and the horizontal-to-vertical growth rate ratio also depends on the silicon-source gas used and the deposition pressure. For example, it is expected that $SiH_4$ would permit depositions at lower temperature than would $SiH_2Cl_2$, while $SiCl_4$ would permit depositions at higher temperatures than $SiH_2Cl_2$. Deposition pressure might be varied, for example, from approximately 100 Torr to atmospheric pressure.

The indicated deposition and etching times can also be varied as a function of gas composition and temperature. For example, it is expected that a practical range of deposition times would be approximately from 30 seconds to 4 minutes, and that a practical range for etching cycle times is approximately 20 seconds to 2 minutes.

During the deposition stage of the described deposition/etching process, silicon precipitates from the silicon-source gas onto all exposed surfaces of the substrate and mask. The silicon that deposits on each nucleation site 18 follows the monocrystalline lattice structure at that site. In contrast, the silicon which precipitates onto the mask 14 has no preferred orientation and therefore deposits in the form of isolated non-single-crystalline aggregates. Additionally, we have observed that at the indicated parameters, deposition of the monocrystalline silicon begins immediately while there is delay of some critical time before the non-single-crystalline deposition occurs on the mask.

The presence of a silicon-etching gas such as HCl during the deposition cycle decreases the probability of non-single-crystalline silicon deposits forming on the mask 14 during deposition. During the deposition stage, the relative quantity of silicon-source gas and silicon-etching gas, and the deposition time, must be balanced, so as to achieve a practical monocrystalline silicon growth rate while retaining the ability to subsequently remove, during the etching stage, the non-single-crystalline silicon which deposits on the mask 14.

The gas composition and duration of the etching stage of the deposition/etching process is designed so as to completely remove all of the non-single-crystalline aggregates which remain on the mask 14 following the deposition stage. Although this etching also removes some of the monocrystalline silicon growing from the nucleation sites 18, the dissolution rate of this monocrystalline silicon is relatively low compared to the dissolution rate of the non-single-crystalline aggregates. Thus, after a single deposition/etching cycle, more silicon is deposited during the deposition stage than is etched during the etching stage, and all of the deposited material is monocrystalline in nature.

The vertical/horizontal monocrystalline growth provided by the described deposition/etching process, permits the fabrication of a variety of useful semiconductor structures. The structure of FIG. 2B might be used, for example, to form a plurality of individual, selectively located semiconductor devices. Such devices might be fabricated, for example, by selectively doping the substrate 10 and silicon islands 20 by conventional semiconductor processing techniques. For example, the interface between each silicon island 20 and the substrate 10 can be made rectifying or nonrectifying depending upon doping, and internal doping profiles within each silicon island 20 and within the substrate 10 can be manipulated using conventional photolithographic techniques.

Figure 3:
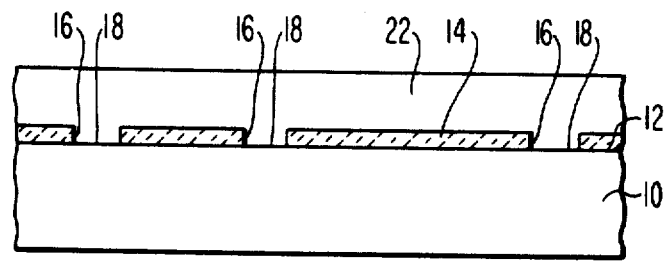
FIGS. 3, 4, 5 and 6 illustrate alternative structures which can be fabricated by the present invention.
Figure 4:
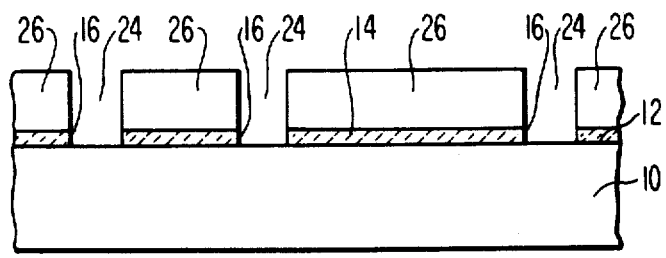
Figure 5:
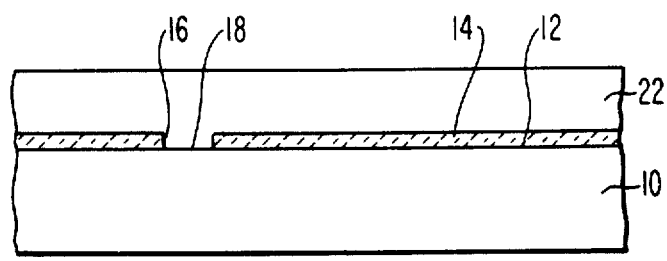

FIGS. 3–6 illustrate alternative structures which can be fabricated by the process of the present invention. By continuing the described deposition/etching process on the structure of FIG. 2B, the plurality of silicon islands 20 will eventually grow together so as to form a continuous monocrystalline silicon layer 22, as illustrated in FIG. 3. FIG. 5 illustrated that a similar structure, of a monocrystalline silicon layer 22 overlying a mask 14, can be fabricated from a single nucleation site 18 exposed by a single aperture 16 in the mask 14.

FIG. 4 represents an alternative embodiment which can potentially be of great significance in the design of integrated circuits. It can be formed by etching cavities 24 in the silicon layer 22 of FIG. 3 in areas corresponding to the apertures 16. In the illustrated embodiment, the cavities 24 extend through the thickness of the silicon layer 22 and through the epitaxial silicon within each aperture 16 so as to expose the substrate surface 12. Thus, if the geometry of the apertures 16 is so designed, a plurality of electrically isolated silicon islands 26 can be generated. A structure of this type might be effectively utilized in a silicon-on-sapphire type (SOS-type) application wherein a plurality of monocrystalline silicon islands are generated on an insulating substrate. Additionally, depending upon the application to which the structure of FIG. 4 will be put, the cavities 24 can subsequently be filled with a dielectric, resistive, or conducting material, so as to yield a more planar structure.

It should be recognized that the structure of FIG. 4 could similarly be fabricated from the single aperture structure of FIG. 5. Also, cavities could be similarly formed in the structure of FIG. 2B or in a structure intermediate between those illustrated in FIG. 2B and FIG. 3.

Figure 6:
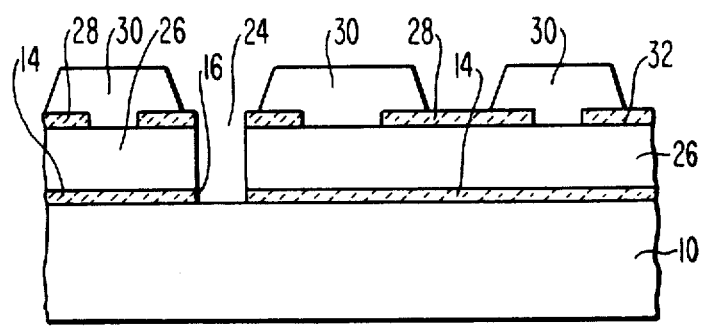

FIG. 6 illustrates an example of a multilevel structure which might be fabricated by the present invention. Isolated monocrystalline silicon islands 26 are fabricated on the apertured mask 14 by the described deposition/etching process. An apertured mask 28 is subsequently formed on the silicon islands 26, and a second set of silicon islands 30 are then similarly epitaxially overgrown thereon. A cavity or plurality of cavities 24 can be formed so as to isolate the silicon islands 26 and/or the silicon islands 30, as desired. Thus, the deposition/etching process of the present invention permits the fabrication of multilevel integrated circuits, each level being selectively isolated by, for example, an $SiO_2$ mask. This can provide a strong impact on the potential packing density and level of integration of future integrated circuits.

It should be recognized that the embodiments disclosed herein are shown for exemplary purposes and are not intended to limit the scope of the present invention. A large variety of single or multilevel structures can be made using the deposition/etching process disclosed herein.

What is claimed is:

1. A method for forming monocrystalline silicon through a mask layer comprising:

providing a semiconductor substrate having a monocrystalline portion at a surface thereof and having a mask layer on said surface, the mask layer having an aperture to said monocrystalline portion;

depositing silicon for a period substantially equal to a critical time, from a silicon-source gas, so as to form monocrystalline silicon on exposed monocrystalline silicon regions and non-monocrystalline silicon on the mask layer, said critical time being a time at which said non-monocrystalline silicon can be removed from the mask layer by etching in situ while retaining a portion of the deposited monocrystalline silicon; and etching in situ directly after said depositing, in a silicon-etching gas, so as to remove the non-monocrystalline silicon from the mask layer while retaining a portion of the deposited monocrystalline silicon and achieve a monocrystalline silicon island extending from the substrate surface at the mask aperture.

2. A method in accordance with claim 1, further comprising:

including a silicon-etching gas with the silicon-source gas during said depositing.

3. A method in accordance with claim 1, wherein the substrate is monocrystalline material.

4. A method in accordance with claim 1, wherein the substrate is polycrystalline material having a grain size greater than the mask aperture size and further comprising:

locating the mask aperture within the boundaries of a grain.

5. A method in accordance with claim 1, further comprising:

the mask layer including a plurality of apertures, each aperture being located over a monocrystalline portion of the substrate.

6. A method in accordance with claim 1, wherein:

the mask layer comprises a material selected from the group consisting of $SiO_2$, $Si_3N_4$, and $Al_2O_3$.

7. A method in accordance with claim 1, wherein:

the silicon-source gas is selected from the group consisting of $SiCl_4$, $SiH_2Cl_2$, $SiHCl_3$, and $SiH_4$.

8. A method in accordance with claim 1, wherein:

said depositing silicon is from a gas mixture which comprises approximately 0.6 volume percent silicon-source gas, 0.6 volume percent HCl, and 98.8 volume percent $H_2$.

9. A method in accordance with claim 1, wherein:

the etching is performed in a gas mixture which comprises approximately 1.2 volume percent HCl and 98.8 volume percent $H_2$.

10. A method in accordance with claim 1, comprising:

depositing and etching within a reactor wherein the temperature range is approximately 1050° C.–1200° C.

11. A method in accordance with claim 1, wherein the deposition and etching cycle comprises:

depositing for approximately 30 seconds to 4 minutes; and etching for approximately 20 seconds to 2 minutes.

12. A method in accordance with claim 1, wherein the silicon-etching gas comprises HCl.

13. A method in accordance with claim 1, wherein said depositing further includes a carrier gas which comprises hydrogen.

14. A method in accordance with claims 1 or 5, comprising:

repeating the deposition and etching cycle so as to form a layer of monocrystalline silicon over substantially the entire mask layer.

15. A method in accordance with claim 1, wherein said monocrystalline silicon island overlaps the mask layer a predetermined distance.

16. A method in accordance with claim 1 further comprising:
repeating said deposition and etching cycle.

* * * * *